United States Patent
Siemieniec et al.

(10) Patent No.: US 9,276,135 B2
(45) Date of Patent: Mar. 1, 2016

(54) JUNCTION FIELD EFFECT TRANSISTOR WITH VERTICAL PN JUNCTION

(71) Applicant: Infineon Technologies AG, Neubiberg (DE)

(72) Inventors: Ralf Siemieniec, Villach (AT); Cedric Ouvrard, Villach (AT)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 14/025,984

(22) Filed: Sep. 13, 2013

(65) Prior Publication Data

US 2015/0076568 A1    Mar. 19, 2015

(51) Int. Cl.
     *H01L 29/80*       (2006.01)
     *H01L 29/808*      (2006.01)
     *H01L 29/739*      (2006.01)
     *H01L 29/08*       (2006.01)

(52) U.S. Cl.
     CPC ........ *H01L 29/8083* (2013.01); *H01L 29/0843* (2013.01); *H01L 29/7392* (2013.01)

(58) Field of Classification Search
     CPC . H01L 29/8083; H01L 29/1608; H01L 29/00; H01L 29/808; H01L 29/1066
     USPC .......................................................... 257/263
     See application file for complete search history.

(56) References Cited

U.S. PATENT DOCUMENTS

2012/0211806 A1*   8/2012   Werner .......................... 257/263
2015/0021682 A1*   1/2015   Bobde et al. ................... 257/330

FOREIGN PATENT DOCUMENTS

DE            10147696 A1     4/2003

OTHER PUBLICATIONS

Treu, M., et al., "Strategic considerations for unipolar SiC switch options: JFET vs. MOSFET." 2007 IEEE 42nd Annual Industry Applications Conference, Sep. 23-27, 2007, pp. 324-330, New Orleans.

Kelley, R., et al., "1700 V Enhancement-mode SiC VJFET for High Voltage Auxiliary Flyback SMPS." PCIM Europe, May 4-6, 2010, pp. 304-308, VDE Verlag GmbH, Berlin.

* cited by examiner

*Primary Examiner* — Monica D Harrison
(74) *Attorney, Agent, or Firm* — Murphy, Bilak & Homiller, PLLC

(57) ABSTRACT

An embodiment relates to a JFET with a channel region and a gate region forming a pn junction. Between a source region and a drain region in a semiconductor portion, the pn junction extends along a vertical direction perpendicular to a first surface of the semiconductor portion. The source, channel and drain regions have a first conductivity type and are arranged along the vertical direction. The gate region and a shielding region between the gate and drain regions have a second, complementary conductivity type. An auxiliary region separates the gate and shielding regions in the semiconductor portion.

20 Claims, 11 Drawing Sheets

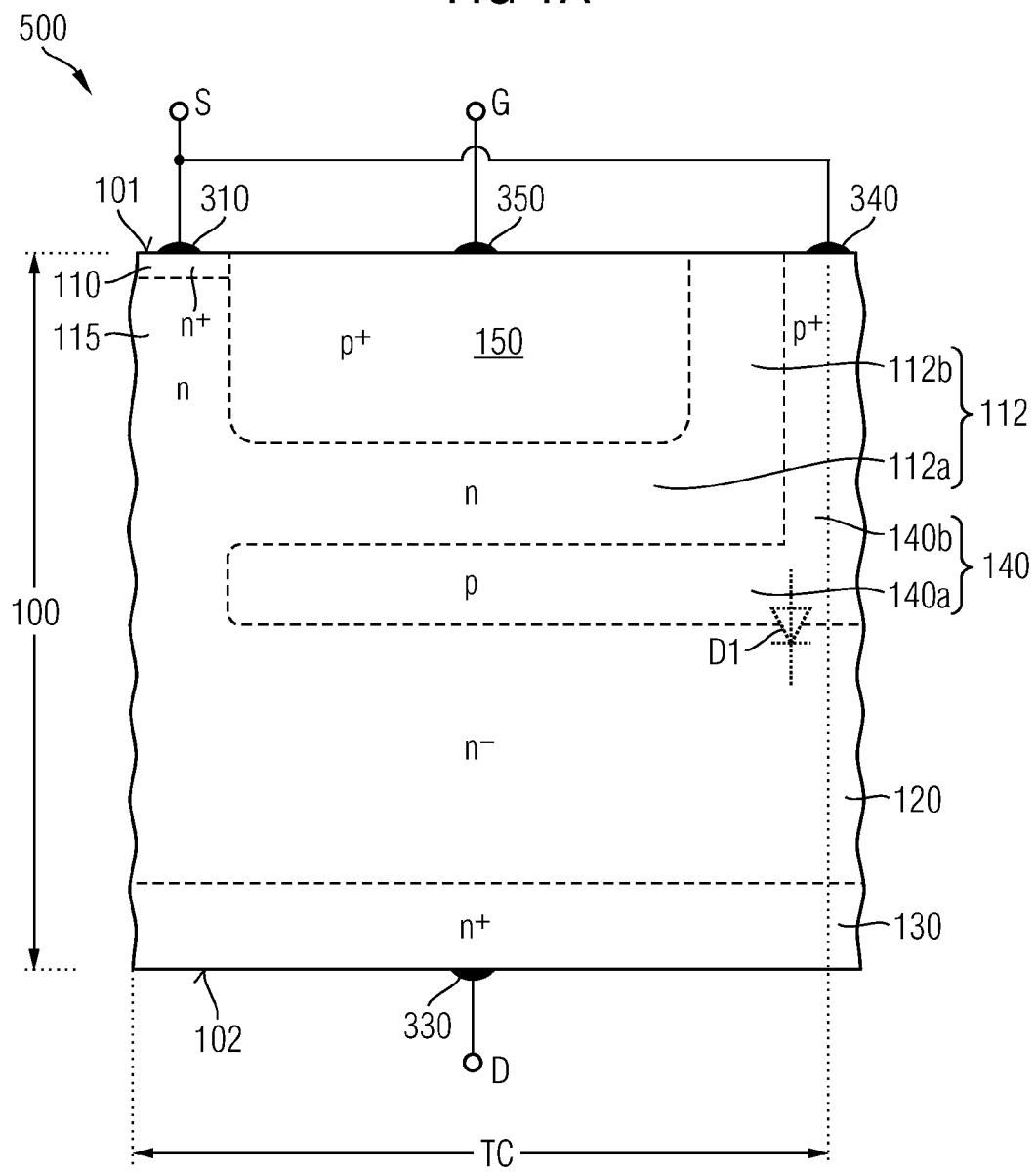

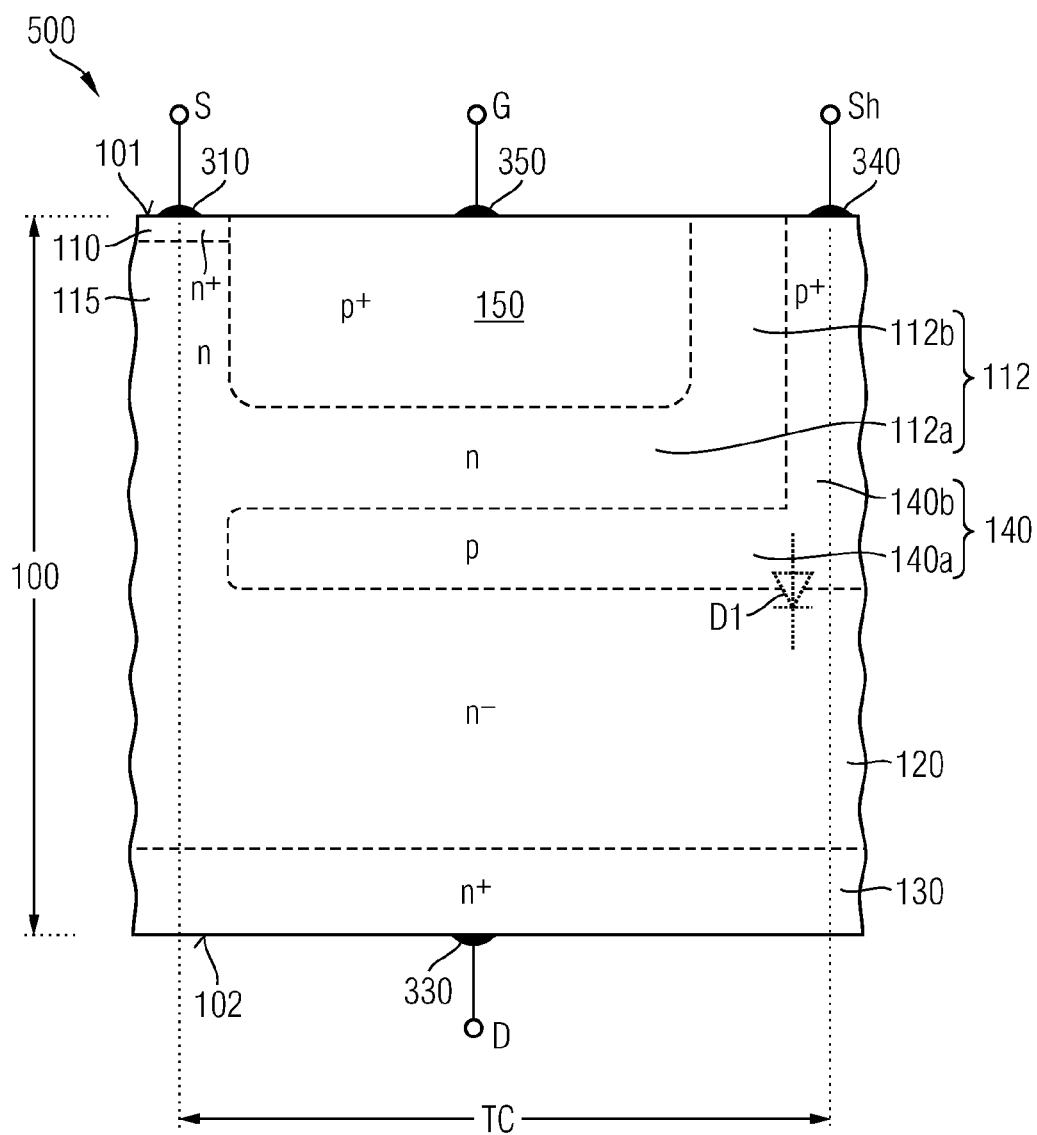

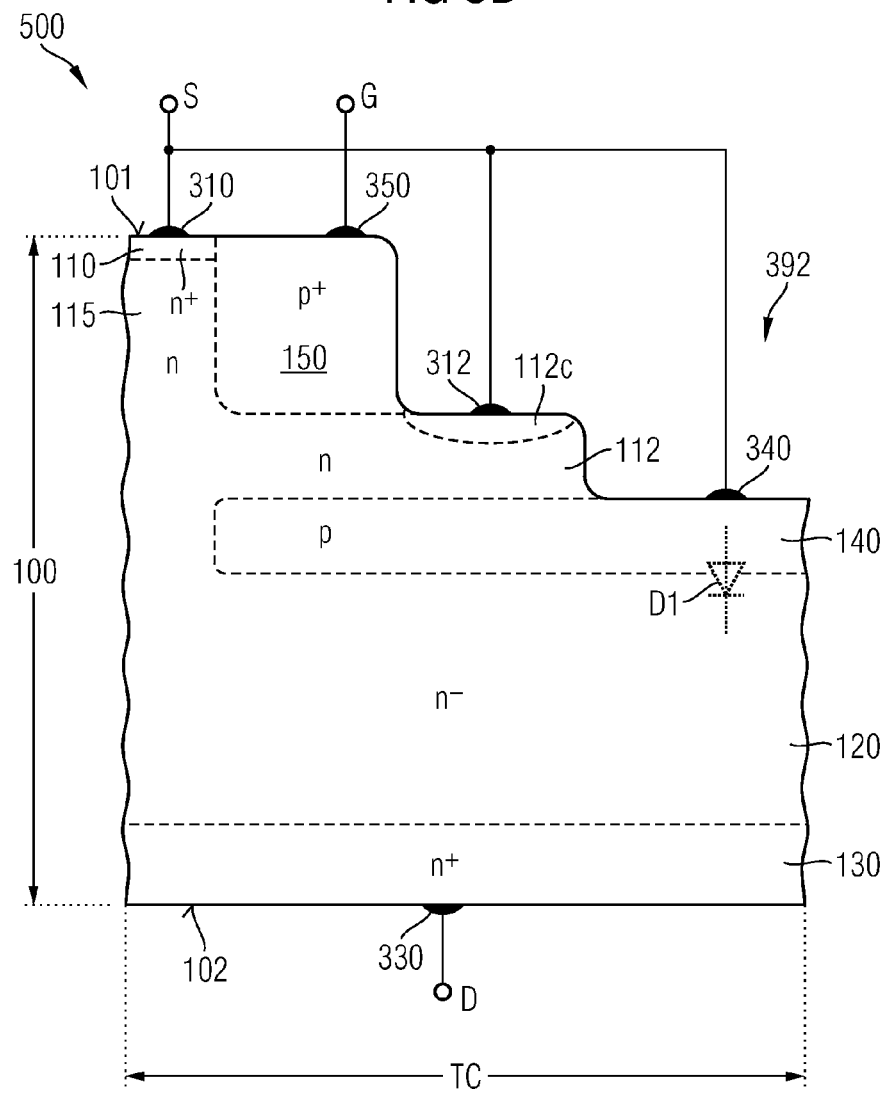

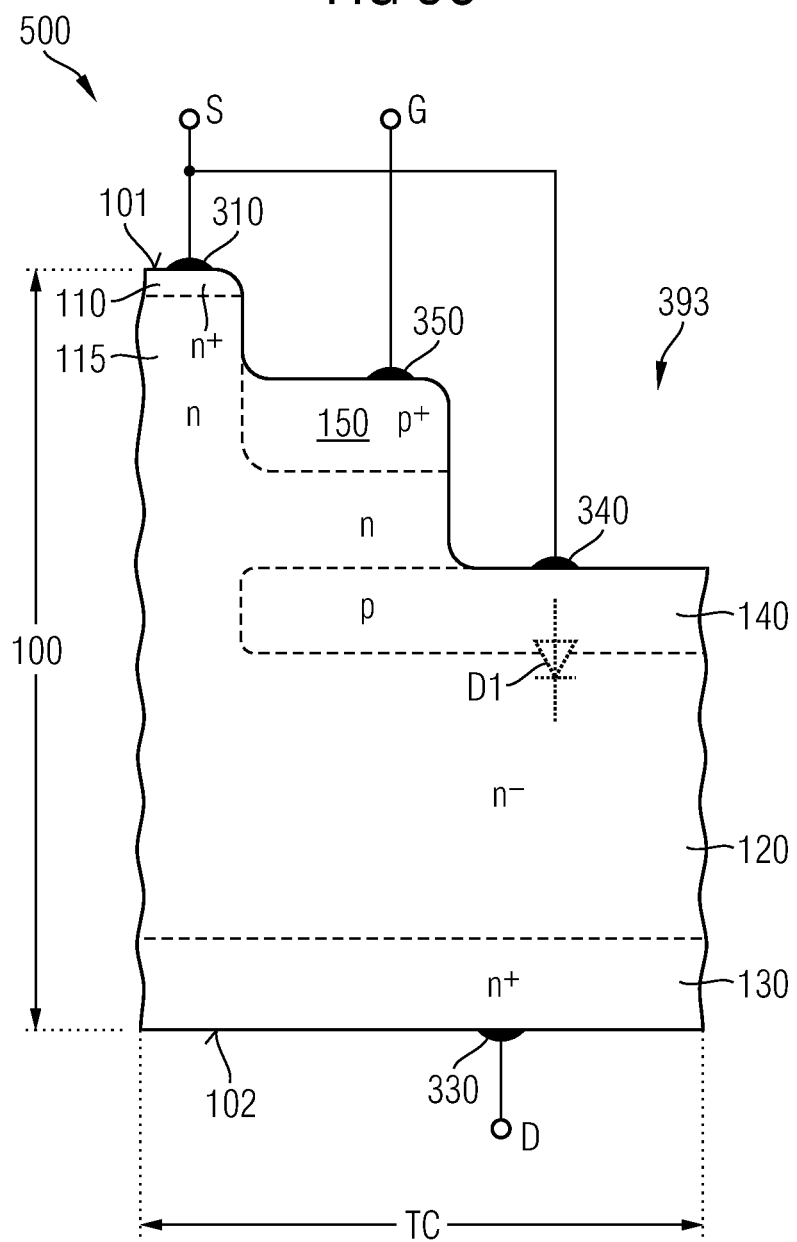

JUNCTION FIELD EFFECT TRANSISTOR WITH VERTICAL PN JUNCTION

BACKGROUND

In JFETs (junction field effect transistors) the extension of a depletion region of a reverse-biased pn-junction modulates the cross-sectional area of a channel region through which a load current controlled by the JFET passes. Since minority charge carrier storage effects influence the operation of JFETs only to a low degree, JFETs can be used in high speed applications. It is desirable to provide JFETs with improved device characteristics.

SUMMARY

An embodiment relates to a JFET including a channel region and a gate region forming a pn junction between the channel and gate regions. The pn junction extends in a semiconductor portion between a source region and a drain region along a vertical direction perpendicular to a first surface of the semiconductor portion. The source, channel and drain regions have a first conductivity type and are arranged along the vertical direction. The gate region and a shielding region between the gate and drain regions have a second, complementary conductivity type. An auxiliary region separates the gate and shielding regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a JFET according to an embodiment providing a shielding region electrically connected to a source region.

FIG. 3A is schematic cross-sectional view of a portion of a JFET in accordance with an embodiment providing a shielding region electrically connected to a shielding terminal.

FIG. 5B is a schematic cross-sectional view of a portion of a JFET in accordance with an embodiment providing an auxiliary electrode connected to a lateral auxiliary region.

FIG. 5C is a schematic cross-sectional view of a portion of a JFET in accordance with an embodiment providing a recessed gate region.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1B:
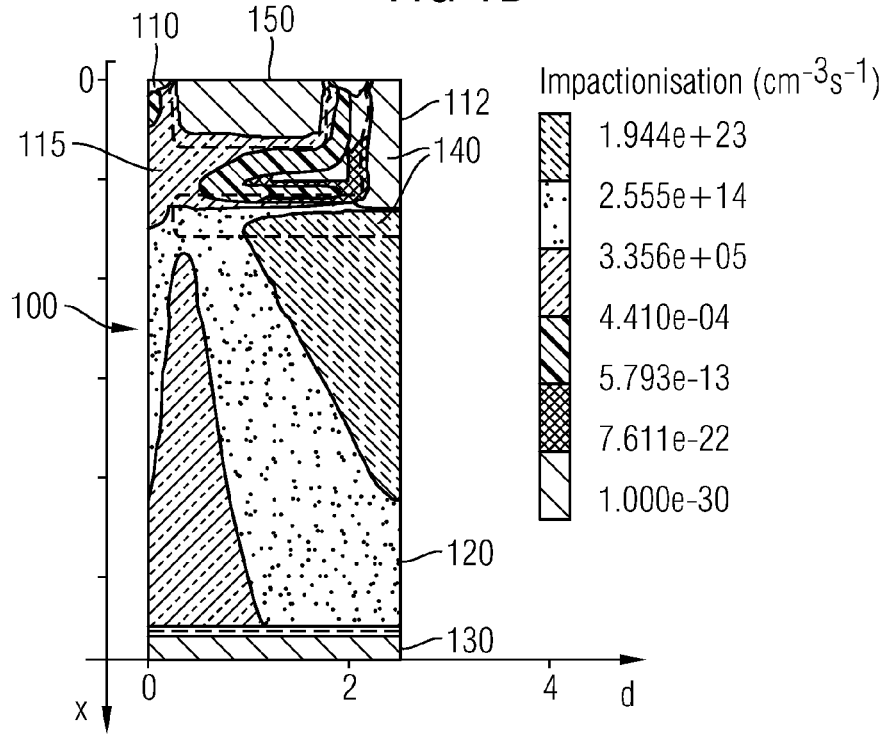
FIG. 1B is a schematic diagram illustrating the local impact ionization rate in the semiconductor portion of FIG. 1A at the breakdown voltage.
Figure 1C:
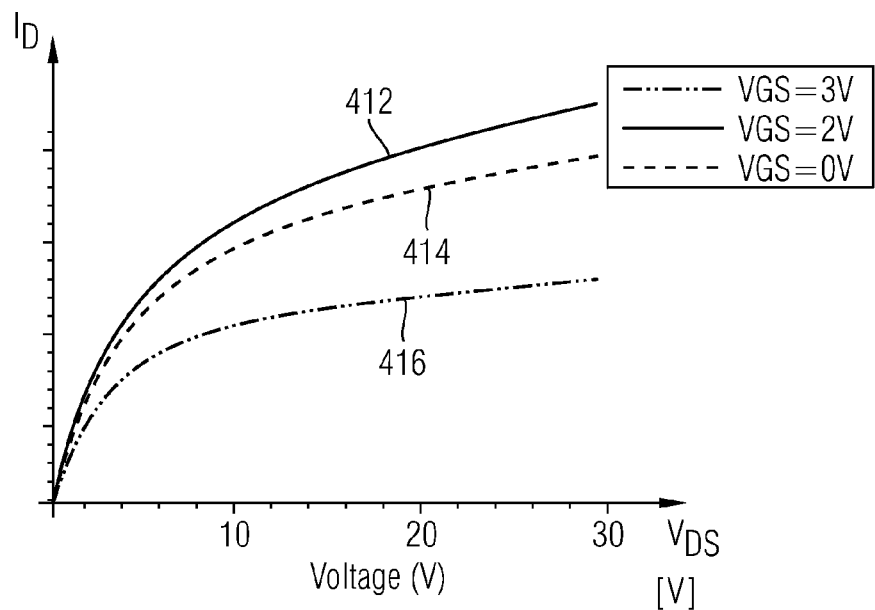
FIG. 1C is a schematic diagram illustrating output characteristics of the JFET of FIG. 1A.

FIGS. 1A to 1C refer to a JFET 500 including a semiconductor portion 100 which is based on a single-crystalline semiconductor material, like silicon carbide SiC, for example 6H—SiC (SiC of the 6H poly type), 15R—SiC, 4H—SiC or 3C—SiC, silicon Si, germanium Ge, or a silicon germanium crystal SiGe, by way of example. The semiconductor portion 100 has a first surface 101, which may be planar or which may include surface sections in parallel planes, and a planar second surface 102 parallel to the first surface 101 or the surface sections. A normal to the first surface 101 or the parallel surface sections defines a vertical direction and directions orthogonal to the vertical direction are lateral directions.

In the semiconductor portion 100 a heavily doped source region 110 may directly adjoin the first surface 101. A source electrode 310 electrically connected to a source terminal S of the JFET 500 may directly adjoin the source region 110.

A drain region 130 having the same impurity type as the source region 110 may be formed in the semiconductor portion 100 on a side opposite to the first surface 101. The drain region 130 may directly adjoin the second surface 102. A drain electrode 330 electrically connected to a drain terminal D of the JFET 500 may directly adjoin the drain region 130.

Along a vertical axis through the source and drain regions 110, 130 a channel region 115 directly adjoins the source region 110. The channel region 115 has the same conductivity type as the source and drain regions 110, 130. A mean net dopant concentration in the source and drain regions 110, 130 is at least ten times the mean net dopant concentration in the channel region 115.

A heavily doped gate region 150 extends from the first surface 101 into the semiconductor portion 100. The gate region 150 has a conductivity type opposite to that of the channel region 115. The channel and gate regions 115, 150 form a pn junction that extends between the source and drain regions 110, 130 along the vertical direction or approximately along the vertical direction. The term "vertical pn junction" includes pn junctions tilted to the vertical direction by at most +/−45 degree. A gate electrode 350 electrically connected or coupled to a gate terminal G of the JFET 500 or to an output of a gate driver circuit integrated in the JFET 500 may directly adjoin the gate region 150.

A voltage applied to the gate region 150 modulates the lateral extension of a depletion zone formed along the pn junction between the gate and channel regions 150, 115. At a certain gate voltage, the depletion zone covers the complete lateral cross-sectional area of the channel region 115 thereby suppressing a current flow between the source and drain regions 110, 130. The JFET 500 may be a normally-off type JFET with no current flow between the source and drain regions 110, 130 when no voltage is applied to the gate region, or a normally-on type JFET.

A main portion of a weakly doped drift layer 120 of the conductivity type of the source and drain regions 110, 130 may form an nn+ or pp+ homojunction with the drain region 130, wherein the homojunction extends parallel to the second surface 102. An ancillary portion of the drift layer 120 may be arranged along the vertical axis through the source, channel and drain regions 110, 115, 130.

A shielding region 140 with the conductivity type of the gate region 150 is between the gate and drain regions 150, 130. The shielding region 140 includes a lateral portion 140a extending parallel to the second surface 102. Vertical projections of the lateral portion 140a of the shielding region 140 and the gate region 150 may overlap by at least 50%. According to an embodiment, the lateral cross-sectional area of the shielding region 140 is equal to or greater than the lateral cross-sectional area of the gate region 150. The shielding region 140 may encompass the complete vertical projection of the gate region 150 into the plane of the shielding region 140.

The shielding region 140 leaves an opening in the vertical projection of the source region 110. The vertical projections of center points or center axes of the opening in the shielding region 140 and the source region 110 may coincide. A lateral cross-sectional area of the opening may be narrower, wider or may have the same size as the lateral cross-sectional area of the source region 110.

The shielding region 140 may or may not have a vertical portion 140b directly adjoining the lateral portion 140a and the first surface 101. A shielding electrode 340 may directly adjoin the shielding region 140. The shielding electrode 340 may be electrically connected or coupled to the source electrode 310, the gate electrode 350, or a shielding terminal Sh of the JFET 500.

An auxiliary region 112, which may be provided from semiconducting material of the conductivity type of the channel region 115, separates the gate and shielding regions 150, 140 from each other in the semiconductor portion 100. The auxiliary region 112 may include a lateral portion 112a extending in substance parallel to the second surface 102 between the gate region 150 and the lateral portion 140a of the shielding region 140. The auxiliary region 112 may include a vertical portion 112b extending along the vertical direction and separating the gate region 150 and the vertical portion 140b of the shielding region 140. The vertical portion 112b may directly adjoin the first surface 101.

The JFET 500 may include a plurality of the channel, gate, drain, source, shielding and auxiliary regions 115, 150, 110, 140, 112 forming more or less identical transistor cells. According to an embodiment, the lateral cross-sectional areas of the source, channel, and shielding regions 110, 115, 140 are stripes and the cells are regularly arranged along one of the lateral directions. For linear applications with less steep voltage or current signals the shielding regions 140 may be electrically connected exclusively at the ends of the stripes.

According to other embodiments, the lateral cross-sectional areas of the source and channel regions 110, 115 may be circles, ovals, ellipses or rectangles, e.g. squares with or without rounded corners, and the transistor cells are arranged in a regular matrix with the shielding regions 140 having a cross-shaped lateral cross-sectional area and being electrically connected at the respective center point, by way of example.

Each of the source, drain, gate, shielding and auxiliary terminals 310, 330, 350, 340, 312 may be provided from one or more conductive materials, for example a metal, a metal alloy or a metal compound such as molybdenum Mo, NiAl, TiAl, W, Ti, Al, C, AlSi, AlSiCu, or AlCu.

Compared to quasi-vertical JFETs with channel regions having a lateral component, the JFET 500 of FIG. 1A provides a higher channel density, an increased total channel area for the on-state current Rds(on)×A and a better area efficiency. Other than quasi-vertical JFETs where the blocking capability depends on the length of the lateral portion of the channel region, the blocking capability of the JFET 500 does not depend on lateral dimensions and therefore does not impose same strict restrictions as regards a migration to smaller lateral dimensions and higher channel densities.

Other than conventional true vertical JFETs the pn junction between the shielding and drift regions 140, 120 provides an integrated body diode D1 which may be effective between the source and drain terminals S, D, e.g. if the shielding electrode 340 is electrically connected to the source electrode 310.

Applying a suitable potential to the shielding region 140 shields the pn junction between the channel and gate regions 115, 150 against the electric field between the source and drain regions 110, 130. As a result, the drain potential influences the on-state characteristics of the JFET 500 only to a low degree compared with conventional true vertical JFETs.

The shielding and gate regions 140, 150 may be formed by counter-implants into one single, in-situ doped epitaxial layer such that less device parameters depend on a growth rate of an epitaxial layer which in some materials like silicon carbide is difficult to control precisely. The mean net impurity concentration may be locally increased in the channel and auxiliary regions 112, 115.

In the illustrated embodiment, the conductivity type of the source, auxiliary, channel, drift, and drain regions 110, 112, 115, 120, 130 is the n type and the conductivity type of the gate and shielding regions 150, 140 is the p type. Equivalent considerations apply to embodiments providing source, auxiliary, channel, drift, and drain regions 110, 112, 115, 120, 130 from p type semiconductor material and the gate and shielding regions 150, 140 from n type semiconductor material.

It can be shown that in the blocking mode the shielding region 140 effectively bars the electric field from entering the channel region 112 provided that a buried edge of the shielding region 140 oriented to the second surface 102 has a sufficient distance to the buried edge of the gate region 150 along the vertical direction. For example, the distance between the buried edge of the shielding region 140 and the gate region 150 may be at least twice the lateral width of the channel region 112 to concentrate, in the blocking mode, the electric field in substance between the drain region 130 and a plane spanned by the buried edge of the shielding region 140.

The following diagrams refer to an embodiment with the shielding region 140 electrically connected to the source electrode 310.

The diagram in FIG. 1B shows that in case of an avalanche breakdown the impact ionization rate, which is proportional to the avalanche generation rate, has a maximum close to the planar pn junction forming the body diode D1 between the shielding and drift regions 140, 120 thereby ensuring a non-critical avalanche behavior and high avalanche ruggedness.

In FIG. 1C a first line 412 gives the current density $I_D/A$ as a function of the drain-to-source voltage $V_{DS}$ for a gate voltage $V_{GS}$=2V, a second line 414 gives $I_D/A$ as a function of $V_{DS}$ at $V_{GS}$=0V and a third line 416 for $V_{GS}$=−3V. At sufficiently negative gate voltages $V_{GS}$, the current density $I_D/A$ does not significantly change for $V_{DS}$>10V.

Figure 2A:
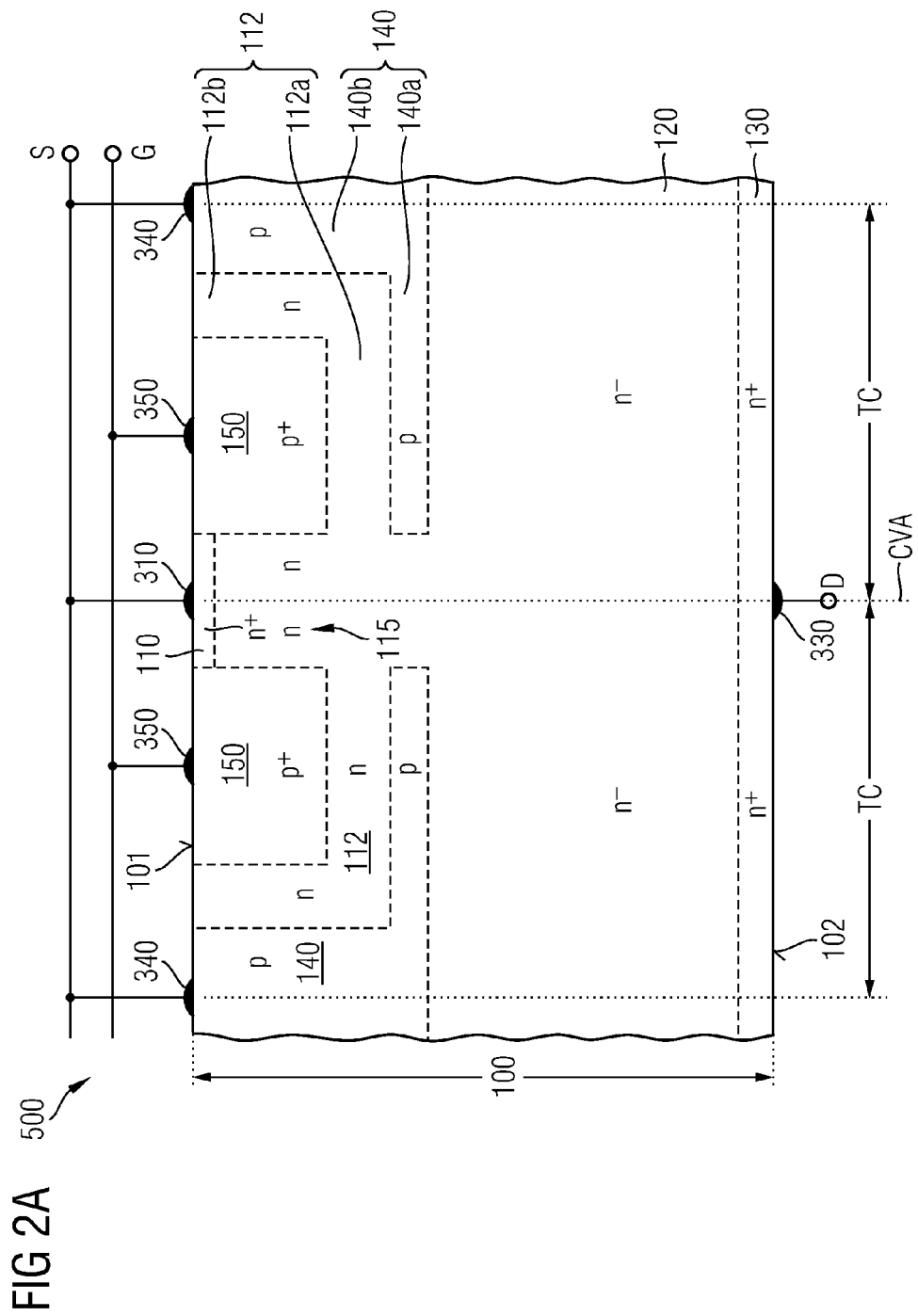
FIG. 2A is a schematic cross-sectional view of a portion of a JFET with a plurality of transistor cells according to an embodiment comprising cell pairs with mirror-inverted transistor cells.

In FIG. 2A, the JFET 500 includes a plurality of transistor cells TC, wherein two adjacent transistor cells TC are arranged mirror-inverted with respect to a central vertical axis CVA through shared source and channel regions 110, 115.

Each single transistor cell TC includes p type gate and shielding regions 150, 140 as well as an n type auxiliary region 112 separating the gate and shielding regions 150, 140 in the semiconductor portion 100. Two neighboring transistor cells TC may share a common n type source region 110, a common channel region 115, and a common source electrode 310, wherein the two neighboring transistor cells TC are arranged mirror-inverted with respect to the central vertical axis CVA in the center of the source and channel regions 110, 115. Pairs of transistor cells TC sharing the same source and channel regions 110, 115, respectively, may be replicated along the lateral direction to form a regular pattern of equidistant transistor cells TC. Two neighboring pairs of transistor cells TC may share a common vertical portion 140b of the shielding region 140 and/or a common shielding electrode 340.

Figure 2B:
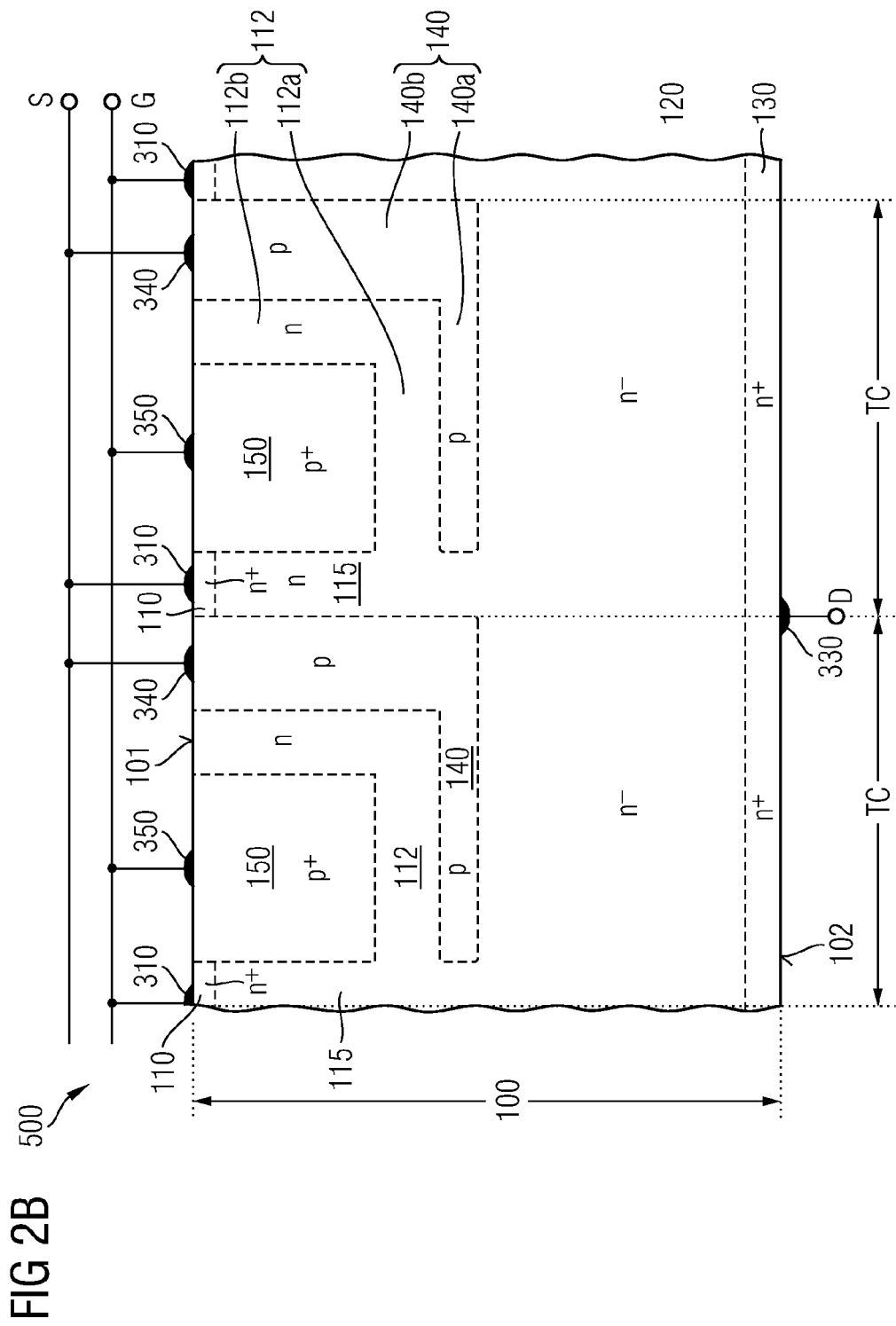
FIG. 2B is a schematic cross-sectional view of a portion of a JFET with a plurality of transistor cells according to an embodiment providing a side-by-side arrangement of the transistor cells.

FIG. 2B refers to a JFET 500 with a plurality of identical or approximately identical transistor cells TC arranged side-by-side at the same lateral orientation. The source and channel regions 110, 112 of a first transistor cell TC may directly adjoin a vertical portion 140b of a shielding region 140 of a neighboring second transistor cell TC such that the shielding region 140 of the second transistor cell TC forms an in substance vertical pn junction with the channel region 115 of the first transistor cell TC.

The JFET 500 of FIG. 3A includes a shielding terminal Sh or a shielding terminal pad electrically connected to the shielding region 140 and electrically separated from the source, gate and drain terminals S, G, D. The additional terminal allows applying a potential to the shielding region 140, which is independent from the potential of the source, gate and drain electrodes S, G, D. In an application environment, for example on a circuit board, the shielding terminal Sh may be electrically connected to a network node having a fixed potential or to a network node whose potential can be altered during operation in dependence of an operation condition or an operation mode.

Figure 3B:
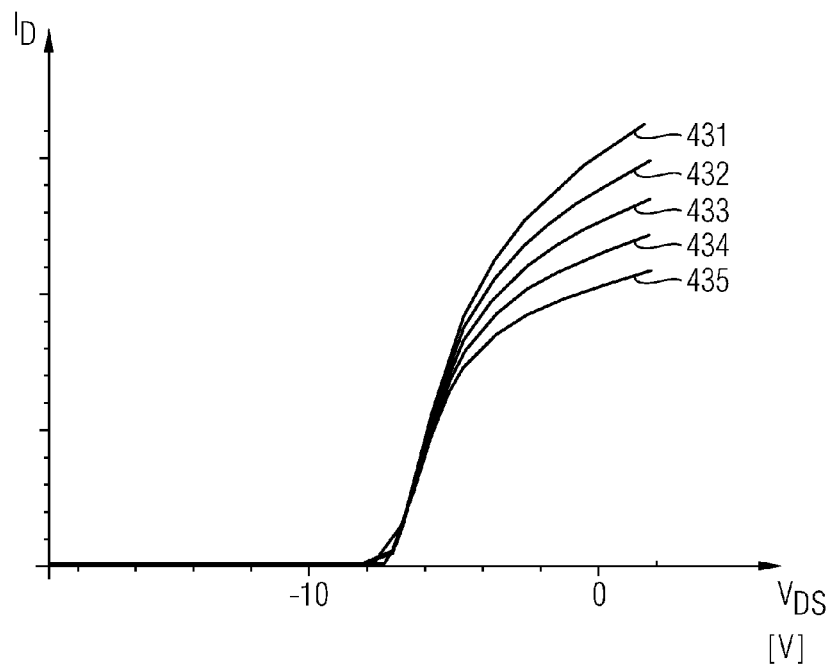
FIG. 3B is a diagram schematically illustrating transfer characteristics of the JFET of FIG. 3A at different shielding voltages.

The diagram in FIG. 3B shows transfer characteristics 431, 432, 433, 434, 435 giving the current density $I_D/A$ as a function of $V_{GS}$ at $V_{DS}$=1V for shielding voltages $V_{Sh}$=+2V, +1V, 0V, −1V and −2V. The dependency of the current density $I_D/A$ on the shielding voltage $V_{Sh}$ is approximately linear for a certain range of $V_{DS}$, $V_{GS}$ and $V_{Sh}$.

Figure 3C:
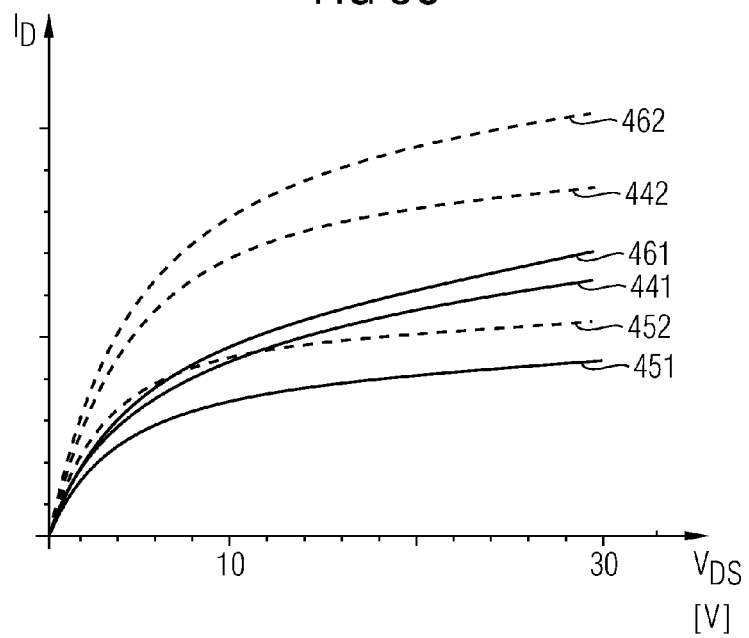
FIG. 3C is a diagram schematically illustrating output characteristics of the JFET of FIG. 3A at different shielding and gate voltages.

FIG. 3C shows the current density $I_D/A$ as a function of $V_{DS}$ for three different $V_{GS}$ at two different shielding voltages $V_{Sh}$, respectively. Output characteristics 441, 442 refer to a $V_{GS}$=0V, wherein output characteristic 441 refers to $V_{Sh}$=−2V and 442 to $V_{Sh}$=+2V. Output characteristic 451 refers to $V_{GS}$=−3V and $V_{Sh}$=−2V. Output characteristic 452 refers to $V_{GS}$=−3V and $V_{Sh}$=+2V. Output characteristics 461 and 462 refer to a $V_{GS}$ of +2V, with output characteristic 461 referring to $V_{Sh}$=−2V and output characteristics 462 to $V_{Sh}$=+2V.

Electrically coupling the shielding terminal Sh to an integrated or external gate driver circuit allows the JFET 500 to implement a dual-gate functionality in linear amplifiers, for example in high-end audio amplifiers. On the other hand, pinning internally or externally the shielding terminal Sh to the potential of the source terminal S allows for using the same JFET 500 in typical switching applications as well.

Figure 3D:
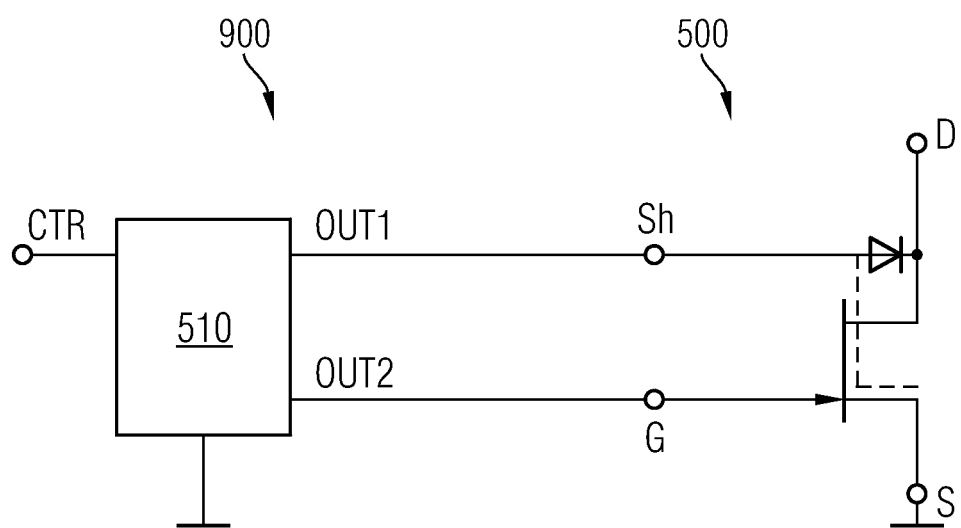
FIG. 3D is a schematic circuit diagram of an electronic circuit in accordance with a further embodiment.

FIG. 3D shows an electronic circuit 900 including a control circuit 510 with an output terminal OUT1 electrically connected to a shielding terminal Sh of a JFET 500. The control circuit 510 may vary a voltage applied to the shielding terminal Sh in response to a signal applied at a control terminal CTR and/or in response to a change of an internal state of the control circuit 510. A gate terminal G of the JFET 500 may be electrically coupled to a further output terminal OUT2 of the control circuit 510 or to a further gate driver circuit, by way of example.

According to an embodiment, the control circuit 510 may alter the voltage applied to the shielding terminal Sh between the voltage provided to one of the load terminals, e.g. the source terminal S, and the voltage provided to the gate terminal G of the JFET 500. For example, at the beginning of a switching cycle the control circuit 510 may apply the potential applied to the gate terminal G to the shielding terminal Sh to improve the gate characteristics and may apply the voltage applied to the source terminal S to the shielding terminal Sh in a later phase of the switching cycle to shield the channel against the drain potential.

Figure 4:
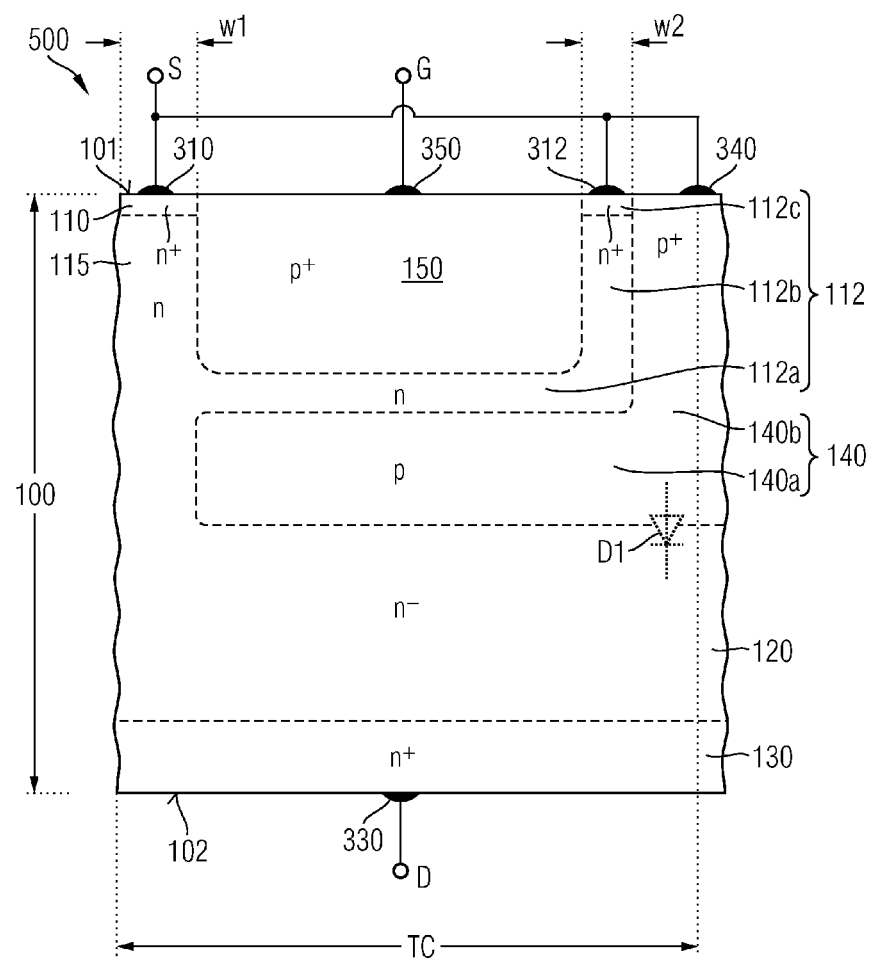
FIG. 4 is a schematic cross-sectional view of a portion of a JFET in accordance with an embodiment providing an auxiliary channel.

The JFET 500 in FIG. 4 in substance corresponds to the JFET 500 in FIG. 1A and further includes an auxiliary electrode 312 directly adjoining the auxiliary region 112. The auxiliary region 112 may include a heavily doped surface region 112c directly adjoining the auxiliary electrode 312 and the vertical portion 112b or the lateral portion 112a of the auxiliary region 112.

The auxiliary electrode 312 may or may not be electrically connected or coupled to the source electrode 310, to an auxiliary terminal or to an electronic element integrated in the JFET 500. The auxiliary electrode 312 allows the auxiliary region 112 to be effective as a controllable ancillary channel region in addition to the main channel region 115. The effective channel region can be further increased.

The ancillary channel may be controlled by the gate region 150 exclusively. Dimensions and impurity concentrations in the auxiliary region 112 may be tuned such that the main and ancillary channels are pinched off at the same gate voltage. For example, the width of the auxiliary region 112 is about half of the width of the channel region 115, or the auxiliary and channel regions 112, 115 have approximately the same width and the mean net impurity concentrations are selected in a suitable manner. For single-gated channel regions 115 as depicted in FIG. 2B a first width of the source region 110 and a second width w2 of the vertical portion 112b of the auxiliary region 112 may be approximately equal provided that the impurity concentrations in the channel and auxiliary regions 115, 112 are approximately equal. For double-gated channel regions 115 as shown in FIG. 2A the first width w1 may be greater than the second width w2 at equal impurity concentrations in the channel and auxiliary regions 115, 112.

In case the shielding region 140 is electrically connected to the gate terminal G, the first and second widths w1, w2 may be approximately equal for both the approach of FIG. 2A and the approach of FIG. 2B.

Other embodiments may adjust the net impurity concentration in at least a portion of the auxiliary region 112 to provide similar pinch-off voltages for the channel and auxiliary regions 115, 112. Further embodiments provide different pinch-off voltages for the main and ancillary channels. Embodiments providing an ancillary channel may be combined with a controllable shielding region 140.

Figure 5A:
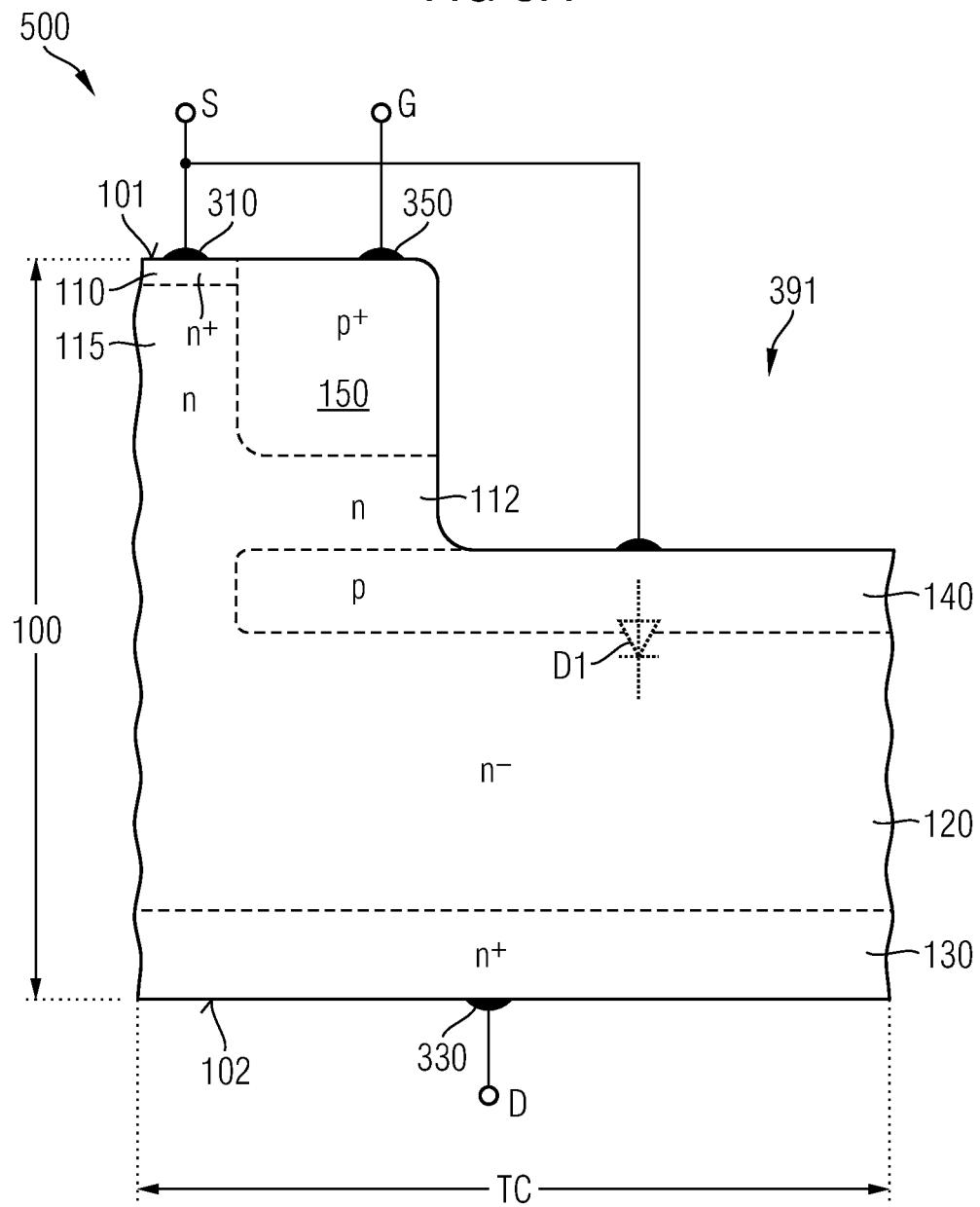
FIG. 5A is a schematic cross-sectional view of a portion of a JFET in accordance with an embodiment providing a shielding electrode connected to a lateral shielding region.

FIG. 5A refers to an embodiment with the source, channel and gate regions 110, 115, 150 formed in protruding portions of the semiconductor portion 100. Sections of the first surface 101 in the protruding portions are plane-parallel with sections of the first surface 101 in recessed portions. Instead of vertical portions of the shielding and auxiliary regions 140, 112 the first surface 101 is at the bottom of a recess and may expose a surface section of the lateral portion 140a of the shielding region 140. A sidewall of the recess 391 exposes the auxiliary region 112.

The JFET 500 of FIG. 5B refers to an embodiment with a two-step recess 392 extending from the top surface plane of the protruding portions into the semiconductor portion 100. Other than in FIG. 5A a lateral surface of the auxiliary region 112 is exposed in addition to a lateral surface of the shielding region 140. An auxiliary electrode 312 may directly adjoin a heavily doped surface portion 112c of the auxiliary region 112. The source, channel and gate regions 110, 115, 150 are formed in a protruding portion of the semiconductor portion 100.

FIG. 5C refers to an embodiment with another two-step recess 393 extending from the top surface plane of the protruding portions into the semiconductor portion 100. The source and channel regions 110, 115 are formed in the protruding portions of the semiconductor portion 100. A planar top surface of the gate region 150 is exposed in the recess 393. The top surface of the gate region 150 oriented to the first surface 101 may be spaced from a buried edge of the source region 110.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A junction field effect transistor, comprising:
   a channel region and a gate region forming a pn junction extending in a semiconductor portion between a source region and a drain region along a vertical direction perpendicular to a first surface of the semiconductor portion, wherein the source, channel and drain regions have a first conductivity type and are arranged along a vertical axis parallel to the vertical direction;
   a shielding region between the gate and drain regions, the shielding and gate regions having a second, complementary conductivity type; and
   an auxiliary region separating the gate and shielding regions.

2. The junction field effect transistor according to claim 1, further comprising:
   a source electrode electrically connected to the source region and electrically separated from the gate region.

3. The junction field effect transistor according to claim 2, wherein
   the source electrode is electrically connected to the auxiliary region.

4. The junction field effect transistor according to claim 2, wherein
   the source electrode is electrically connected to the auxiliary and shielding regions.

5. The junction field effect transistor according to claim 1, wherein
   the auxiliary region is provided from a semiconductor material having the first conductivity type.

6. The junction field effect transistor according to claim 1, further comprising:
   a drift region separating the channel and drain regions along the vertical direction, wherein a net impurity concentration in the drain region exceeds at least ten times a mean net impurity concentration in the drift region.

7. The junction field effect transistor according to claim 1, wherein
   the channel region directly adjoins the source region.

8. The junction field effect transistor according to claim 1, wherein
   the shielding region comprises a lateral portion extending parallel to the first surface and a vertical portion directly adjoining the first portion and extending in the vertical direction.

9. The junction field effect transistor according to claim 8, further comprising:
   a shielding electrode directly adjoining the lateral portion of the shielding region.

10. The junction field effect transistor according to claim 1, wherein
    the auxiliary region comprises a lateral portion extending parallel to the first surface and a vertical portion directly adjoining the first portion and extending in the vertical direction.

11. The junction field effect transistor according to claim 1, further comprising:
    a further gate region, a further auxiliary region and a further shielding region arranged mirror-inverted to the gate, auxiliary, and shielding regions with respect to a central vertical axis of the source and channel regions to form a pair of transistor cells.

12. The junction field effect transistor according to claim 11, wherein
a plurality of pairs of the transistor cells are arranged along a lateral direction parallel to the first surface and the shielding regions of adjacent pairs of transistor cells directly adjoin each other.

13. The junction field effect transistor according to claim 1, wherein
the source, channel, gate, auxiliary, and shielding regions form a transistor cell and a plurality of transistor cells are arranged along a lateral direction parallel to the first surface, and
the source and channel regions of one of the transistor cells directly adjoin the shielding region of an adjacent one of the transistor cells, respectively.

14. The junction field effect transistor according to claim 1, wherein the source and shielding regions are electrically connected.

15. The junction field effect transistor according to claim 1, wherein
the semiconductor portion is provided from silicon carbide.

16. The junction field effect transistor according to claim 1, further comprising:
a shielding terminal electrically coupled to the shielding region and electrically separated from the gate region.

17. An electronic circuit, comprising:
a junction field effect transistor according to claim 16; and
a control circuit including an output terminal electrically connected or coupled to the shielding terminal of the junction field effect transistor.

18. The electronic circuit according to claim 17, wherein
the control circuit is configured to temporarily output a first voltage corresponding to a voltage at a load terminal of the junction field effect transistor and to temporarily output a second, different voltage in response to a signal applied to an input terminal of the control circuit or in response to an internal state of the control circuit.

19. The junction field effect transistor according to claim 1, further comprising:
a plurality of each of the channel, gate, drain, source, shielding and auxiliary regions, wherein the source regions are arranged in a matrix and the shielding regions have a cross-shaped lateral cross-sectional area parallel to the first surface.

20. The junction field effect transistor according to claim 1, further comprising:
a plurality of each of the channel, gate, drain, source, shielding and auxiliary regions, wherein the source regions have a stripe-shaped lateral cross-sectional area parallel to the first surface.

\* \* \* \* \*